United States Patent
Lu et al.

(10) Patent No.: US 7,940,599 B2
(45) Date of Patent: May 10, 2011

(54) DUAL PORT MEMORY DEVICE

(75) Inventors: Olga R. Lu, Austin, TX (US); Lawrence F. Childs, Austin, TX (US); Thomas W. Liston, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 52 days.

(21) Appl. No.: 12/404,892

(22) Filed: Mar. 16, 2009

(65) Prior Publication Data
US 2010/0232202 A1    Sep. 16, 2010

(51) Int. Cl.
G11C 7/00    (2006.01)
G11C 7/10    (2006.01)
G11C 8/00    (2006.01)

(52) U.S. Cl. .............. 365/230.05; 365/189.04; 365/202; 365/203

(58) Field of Classification Search .............. 365/230.05
See application file for complete search history.

(56) References Cited

U.S. PATENT DOCUMENTS

| | | |
|---|---|---|
| 4,918,664 A | 4/1990 | Platt |
| 5,001,671 A | 3/1991 | Koo et al. |
| 5,003,513 A | 3/1991 | Porter et al. |
| 5,206,833 A | 4/1993 | Lee |
| 5,289,432 A | 2/1994 | Dhong et al. |
| 5,440,717 A | 8/1995 | Bosshart |
| 5,666,321 A | 9/1997 | Schaefer |
| 5,781,480 A | 7/1998 | Nogle et al. |
| 5,852,608 A | 12/1998 | Csoppensky et al. |
| 6,078,527 A | 6/2000 | Roth et al. |
| 6,201,758 B1 * | 3/2001 | Morishima et al. ...... 365/230.05 |
| 6,430,088 B1 | 8/2002 | Plants et al. |
| 7,042,793 B2 * | 5/2006 | Masuo ..................... 365/230.05 |
| 7,116,605 B2 | 10/2006 | Hong |
| 7,260,018 B2 * | 8/2007 | Nii ........................... 365/230.05 |
| 7,692,974 B2 * | 4/2010 | Amirante et al. ......... 365/189.04 |
| 7,742,350 B2 * | 6/2010 | Yamaguchi et al. .......... 365/201 |
| 2008/0316851 A1 * | 12/2008 | Kinoshita et al. ........ 365/230.05 |

OTHER PUBLICATIONS

Motorola Inc., Motorola Semiconductor Technical Data, "Advance Information 64K×18 Bit Synchronous Dual I/O, Dual Address SRAM," #MCM69D618/D, 1997, pp. 1-16.

Motorola Inc., Motorola Fast SRAM Data, "Fast Static RAM Component and Module Data," #MCM62110,1997, 32 pages.

Motorola Inc., Motorola Semiconductor Technical Data, "Advance Information 64K×18 Bit Synchronous Separate I/O Fast SRAM," #MCM69Q618/D, 1997, 12 pages.

(Continued)

Primary Examiner — Son L Mai

(57) ABSTRACT

A multi-port memory device having a storage node, a precharge node, a first, second, third, and fourth transistor, and a control module. The first transistor includes a current electrode connected to the storage node, another current electrode connected to a first bit line, and a gate connected to a first wordline. The second transistor includes a current electrode connected to the storage node, another current electrode connected to a second bit line, and a gate connected to a second wordline. The third transistor includes a current electrode connected to the reference node, another current electrode connected to the first bit line, and a gate. The fourth transistor includes a current electrode connected to the precharge node, another current electrode connected to the second bit line, and a gate. The control module deactivates the fourth transistor in response to a dummy access of the first storage module at the second transistor.

18 Claims, 8 Drawing Sheets

OTHER PUBLICATIONS

Quality Semiconductor, Inc., "QS70261A, QS7026A Preliminary, High-Speed CMOA 16K×16 Asynchronous Dual-Port RAM," MDSF-00012-6, Jun. 6, 1996, pp. 1-22.

Integrated Device Technology, Inc., "High-Speed 32K×6 Synchronous Pipelined Dual-Port Static RAM," Preliminary IDT709279A/L, Section 6.26, 1998, pp. 1-16.

* cited by examiner

DUAL PORT MEMORY DEVICE

BACKGROUND

1. Field of the Disclosure

The present disclosure relates generally to devices having memory, and more particularly to device having a multiple port memory.

2. Description of the Related Art

The amount of power consumed by an integrated circuit memory device is generally proportional to the voltage at which the memory device operates. Therefore, it can be beneficial to reduce the operating voltage of a memory device. Unfortunately, circuit functionality and reliability can be impaired when the operating voltage approaches the threshold voltage of the transistors incorporated at the memory device. Functionality and reliability issues are further affected in a negative way by the reduced physical size of transistors and other circuit components resulting from advances in integrated circuit fabrication technology. Memory devices can be particularly susceptible to these issues.

Individual transistors and other components included at a memory device naturally exhibit variations in their electrical characteristics resulting from the manufacturing process. These variations can affect the electrical behavior of the memory. Therefore, a circuit designer considers these variations when designing the memory device so that the manufactured memory device achieves its stated operating specifications, including a minimum operating voltage and a minimum access speed.

A memory can be classified as a dynamic memory or a static memory depending upon whether its bit cells need to be periodically refreshed. Each bit cell is generally configured to store a single binary bit of information. A bit cell can be further classified as a single port bit cell or a multiple port bit cell based on how data is stored and retrieved from the bit cell. For example, a single port bit cell includes one port that is used to both store and retrieve information at the bit cell. A dual port bit cell can include two ports that each support storage and retrieval of information at the bit cell independent and asynchronous from the other port. For example, information can be stored at a dual port bit cell via one port and the information can be retrieved via another port. A dual port bit cell is particularly susceptible to problems associated with low operating voltage, compared to a single port bit cell.

BRIEF DESCRIPTION OF THE DRAWINGS

The present disclosure may be better understood, and its numerous features and advantages made apparent to those skilled in the art by referencing the accompanying drawings.

DETAILED DESCRIPTION

The electrical properties of transistors and other components included at an integrated circuit memory device can vary from one manufactured device to another. The circuitry of a memory device is generally designed with adequate operating margin so that stated specifications of the memory device are achieved despite adverse variations of the electrical properties. One characteristic associated with the operation of a memory bit cell is referred to as write margin. The write margin of a bit cell generally quantifies the extent of such variation that can occur and still permit information to be successfully stored at the bit cell. For example, a memory device can be designed to operate correctly despite a six-sigma variation in a particular electrical property of the transistors included at the memory device. The write margin of a dual port bit cell can be compromised because the ability to store information at the bit cell using one port is adversely affected by a concurrent retrieval of information from the bit cell at a second port.

Figure 1:
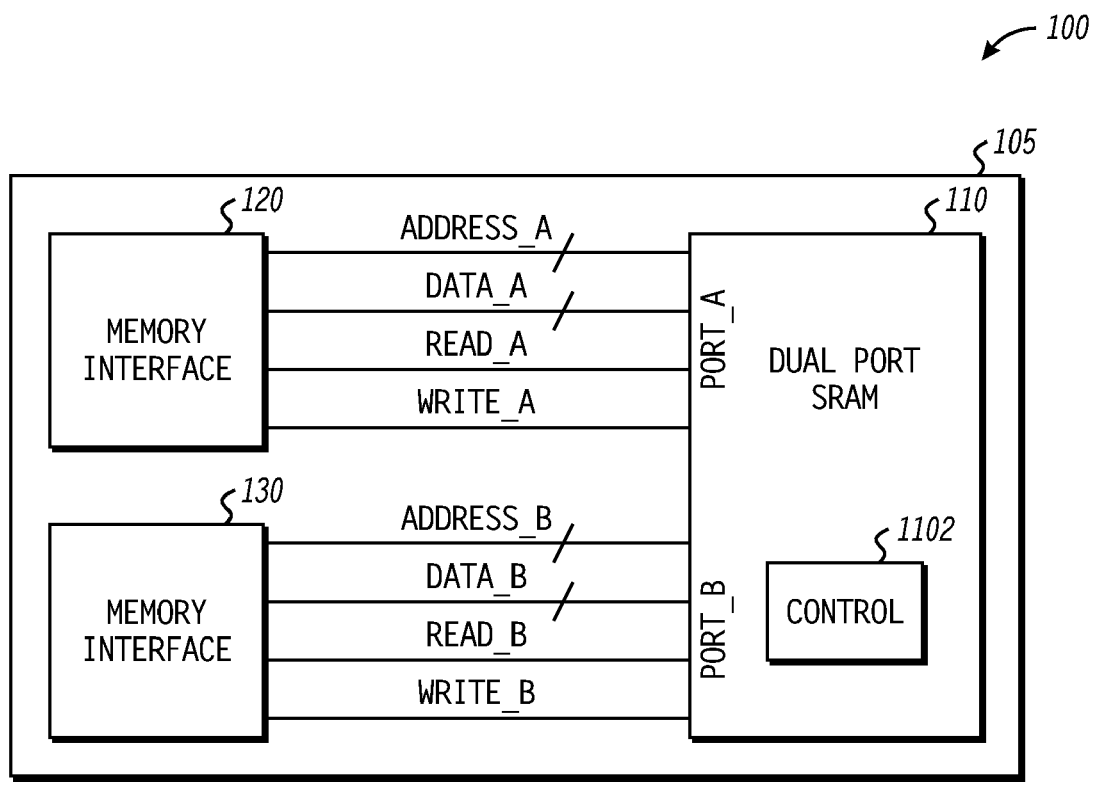
FIG. 1 is a block diagram illustrating a dual port static random access memory (SRAM) included at a data processing device in accordance with a specific embodiment of the present disclosure.

FIG. 1 is a block diagram illustrating a dual port SRAM 110 included at a device 100 that can include an integrated circuit data processing device 105 in accordance with a specific embodiment of the present disclosure. Data processing device 105 also includes memory interface module 120 and memory interface module 130. Dual port SRAM 110 includes control module 1102. Dual port SRAM 110 includes two access ports labeled "PORT A" and "PORT B." Memory interface module 120 is connected to dual port SRAM 110 via nodes ADDRESS_A, DATA_A, READ_A, and WRITE_A. Memory interface module 130 is connected to dual port SRAM 110 via nodes ADDRESS_B, DATA_B, READ_B, and WRITE_B.

Dual port SRAM 110 includes two ports and is configured to support independent and asynchronous accesses by either one or both of memory interface module 120 and memory interface module 130. For example, memory interface module 120 can store information at one dual port bit cell of SRAM 110 and memory interface module 130 can concurrently retrieve information at another dual port bit cell of SRAM 110. Alternatively, memory interface module 120 and memory interface module 130 can independently retrieve information stored at the same dual port bit cell or at different dual port bit cells of dual port SRAM 110. It will be appreciated that restrictions regarding concurrent accesses of a particular dual port bit cell at dual port SRAM 110 can be specified. For example, only one of memory interface module 120 or memory interface module 130 can store information at a dual port bit cell of SRAM 110 at a particular time. Furthermore, information cannot be deterministically retrieved from a particular dual port bit cell via one port while information is being stored at the same dual port bit cell via the other port.

Control module 1102 is configured to control the generation of signals associated with bit lines and word lines of dual port SRAM 110 based on concurrent activity at both ports of dual port SRAM 110. Control module 1102 monitors access requests received at each port of dual port SRAM 110 and configures dual port SRAM 110 appropriately based on the particular memory address associated with each request. The operation of control module 1102 is described in detail with reference to FIGS. 4 and 5.

Memory interface module 120 and memory interface module 130 are configured to provide appropriate signals to dual port SRAM 110 to perform a desired memory access. A memory access can include a write operation whereby information is stored at dual port SRAM 110, or can include a read operation whereby information is retrieved from dual port SRAM 110. Each access port of SRAM 110 is configured to receive memory access requests from a corresponding memory interface module. A memory interface module, such as memory interface module 120, processes a memory access request for an associated data processing device, and executes the desired access using signals conducted via nodes ADDRESS_A, DATA_A, READ_A, and WRITE_A.

Figure 2:
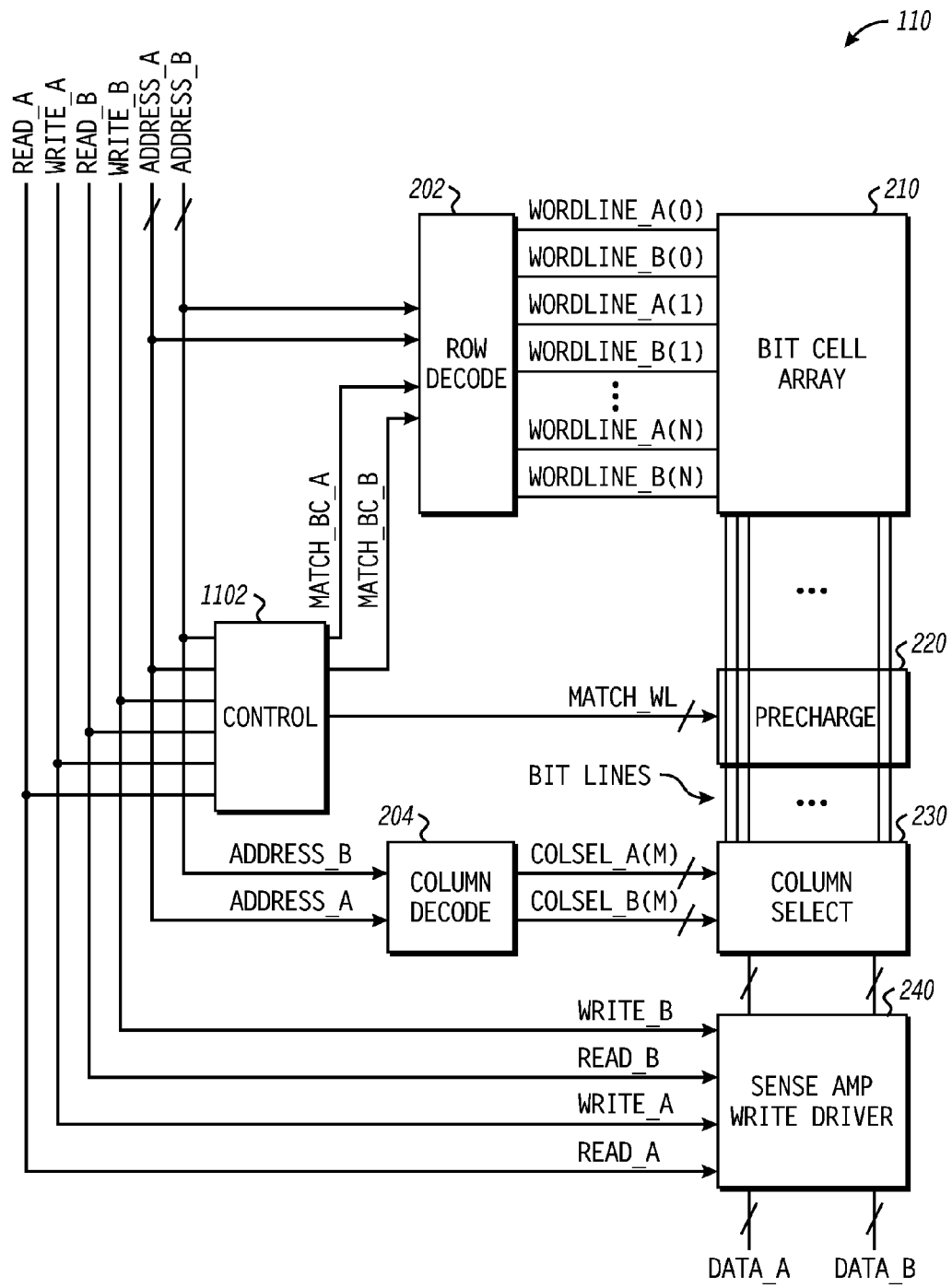
FIG. 2 is a block diagram illustrating the dual port SRAM of FIG. 1 in accordance with a specific embodiment of the present disclosure.

FIG. 2 is a block diagram illustrating the dual port RAM 110 of FIG. 1 in accordance with a specific embodiment of the present disclosure. Dual port SRAM 110 includes control module 1102, a row decode module 202, a column decode module 204, a bit cell array 210, a precharge module 220, a column select module 230, and a sense amplifier and write driver module 240. Control module 1102 has inputs to receive address signals labeled "ADDRESS_A," and "ADDRESS_B," read signals labeled "READ_A," and "READ_B," and write signals labeled "WRITE_A," and "WRITE_B." Control module 1102 has an output to provide signals labeled "MATCH_BC_A" and "MATCH_BC_B" to row decode module 204, and another output to provide a signal labeled "MATCH_WL" to precharge module 220.

Row decode module 202 has inputs to receive address signal ADDRESS_A and ADDRESS_B, and signals MATCH_BC_A and MATCH_BC_B. Row decode module 202 has outputs to provide signals labeled "WORDLINE_A(0)," "WORDLINE_B(0)," "WORDLINE_A(1)," "WORDLINE_B(1)," "WORDLINE_A(N)," and "WORDLINE_B(N)" to bit cell array 210. Row decode module 202 is configured to decode a portion of binary-encoded signals ADDRESS_A and ADDRESS_B into a plurality of word line signals. ADDRESS_A specifies a particular dual port bit cell to be accessed via PORT A, and ADDRESS_B specifies the same or a different dual port bit cell to be accessed via port B. Row decode module 202 decodes signal ADDRESS_A and ADDRESS_B independently, and asserts a single word line associated with PORT_A and a single word line associated with port B. Word line signals are arranged in pairs and each pair is associated with a unique row at bit cell array 210. For example, signal WORDLINE_A(0) and signal WORDLINE_B(0) provide a row address to the first row at bit cell array 210. Signal WORDLINE_A(0) is associated with PORT_A of dual port SRAM 110, and signal WORDLINE_B(0) is associated with PORT_B of dual port SRAM 110.

Column decode module 204 has inputs to receive address signals ADDRESS_A and ADDRESS_B, and outputs to provide signals labeled "COLSEL_A(M)" and "COLSEL_B(M)" to column select module 230." Column decode module 204 is configured to decode another portion of binary-encoded signals ADDRESS_A and ADDRESS_B into a plurality of column select signals represented by signals COLSEL_A(M) and COLSEL_B(M). Column decode module 202 decodes signal ADDRESS_A and ADDRESS_B independently, and asserts a single column select associated with PORT_A and a single column select associated with port B. Column select signals are also arranged in pairs, and each pair is associated with a unique column at bit cell array 210. For example, signal COLSEL_A(0) and signal COLSEL_B(0) enable the selection of the first column at bit cell array 210. Signal COLSEL_A(0) is associated with PORT_A of dual port SRAM 110, and signal COLSEL_B(0) is associated with PORT_B of dual port SRAM 110.

Bit cell array 210 is connected to precharge module 220 and column select module 230 via a plurality of bit-lines 222. Column select module 230 is connected to sense amplifier and write driver module 240. Sense amplifier and write driver module 240 has inputs to receive write signals WRITE_A and WRITE_B, and read signals READ_A and READ_B, and a bidirectional interface to conduct signals labeled "DATA_A." and "DATA_B."

Bit cell array 210 includes a two dimensional array of dual port bit cells that are each configured to store a single binary bit of information. Each dual port bit cell is selected for access by a corresponding set of word lines and bit-lines, and is described in detail with reference to FIG. 3. Word lines, such as WORDLINE_A(0), are associated with rows at bit cell array 210, and bit-lines 222 are associated with columns at bit cell array 210.

As previously described, control module 1102 is configured to control the generation of signals associated with bit-lines and word lines of dual port SRAM 110 based on concurrent activity at both ports of dual port SRAM 110. Signal MATCH_BC_A is asserted to disable the active word line associated with PORT_A of dual port SRAM 110 when control module 1102 determines that a read operation to a dual port bit cell associated with PORT_A of dual port SRAM 110 is concurrent with a write operation at PORT_B to the same dual port bit cell. Signal MATCH_BC_B is asserted to disable the active word line associated with PORT_B of dual port SRAM 110 when control module 1102 determines that a read operation to a dual port bit cell associated with at PORT_B of dual port SRAM 110 is concurrent with a write operation at PORT_A to the same dual port bit cell.

Signal MATCH_WL is asserted when a write operation is underway at a dual port bit cell via PORT A, and a read or a write access is concurrently underway via PORT_B to another dual port bit cell associated with the same word line, but not at PORT_B of the dual port bit cell where the write operation is being performed. As a result, PORT_B associated with the dual port bit cell that is being written is activated. As a result, the dual port bit cell is affected by a bit-line that is unrelated to the write operation that is underway at that dual port bit cell. The condition where a dual port bit cell has at least one of its word lines asserted even though it is not being accessed is referred to herein as a dummy access with respect to the dual port bit cell that bit cell. The occurrence of a dummy access to at least one dual port bit cell connected to a specific word line occurs when the word lines associated with both PORT_A and PORT_B are concurrently asserted. Signal MATCH_WL is operable to disable precharging of selected bit-lines and to equalize signals at the two bit-lines corresponding PORT_A and PORT_B of a selected column when a dummy access is detected. Note that any access to one dual port bit cell via a particular word line results in every other dual port bit cell associated with that word line being in a dummy access state.

Precharge module 220 is configured to charge each bit-line of bit-lines 222 to a precharge voltage to facilitate a read operation at any associated bit cell. Bit-lines 222 are arranged in pairs, wherein the bit-lines of a pair are driven to an opposite logical state during a read or write operation.

Column select module 230 is configured to provide bidirectional communication of information between selected bit-lines of bit-lines 222 and sense amplifier and write driver module 240 based on column select signals COLSEL_A(M) and COLSEL_B(M).

Sense amplifier and write driver module 240 is configured to provide information to bit cell array 210 during a write operation and to receive information from bit cell array 210 during a read operation. PORT_A and PORT_B at dual port SRAM 110 can operate independently. For example, sense amplifier and write driver module 240 can receive information being read from bit cell array 210 via PORT_A and simultaneously provide information being written to bit cell array 210 via port B. Drivers included at sense amplifier and write driver module 240 are configured to drive the bit-lines of each pair of bit-lines to an opposite logic state during a write operation based. Sense amplifiers included at sense amplifier and write driver module 240 are configured to detect a differential voltage at the bit-lines of each pair of bit-lines during a read operation being accessed from bit cell array 210 based on an address provided by signal ADDRESS_A or ADDRESS_B. During a write operation, information is received from a memory interface module via signal DATA_A or DATA_B and stored at appropriate bit cells at bit cell array 210 based on an address provided by signal ADDRESS_A or ADDRESS_B.

Figure 3:
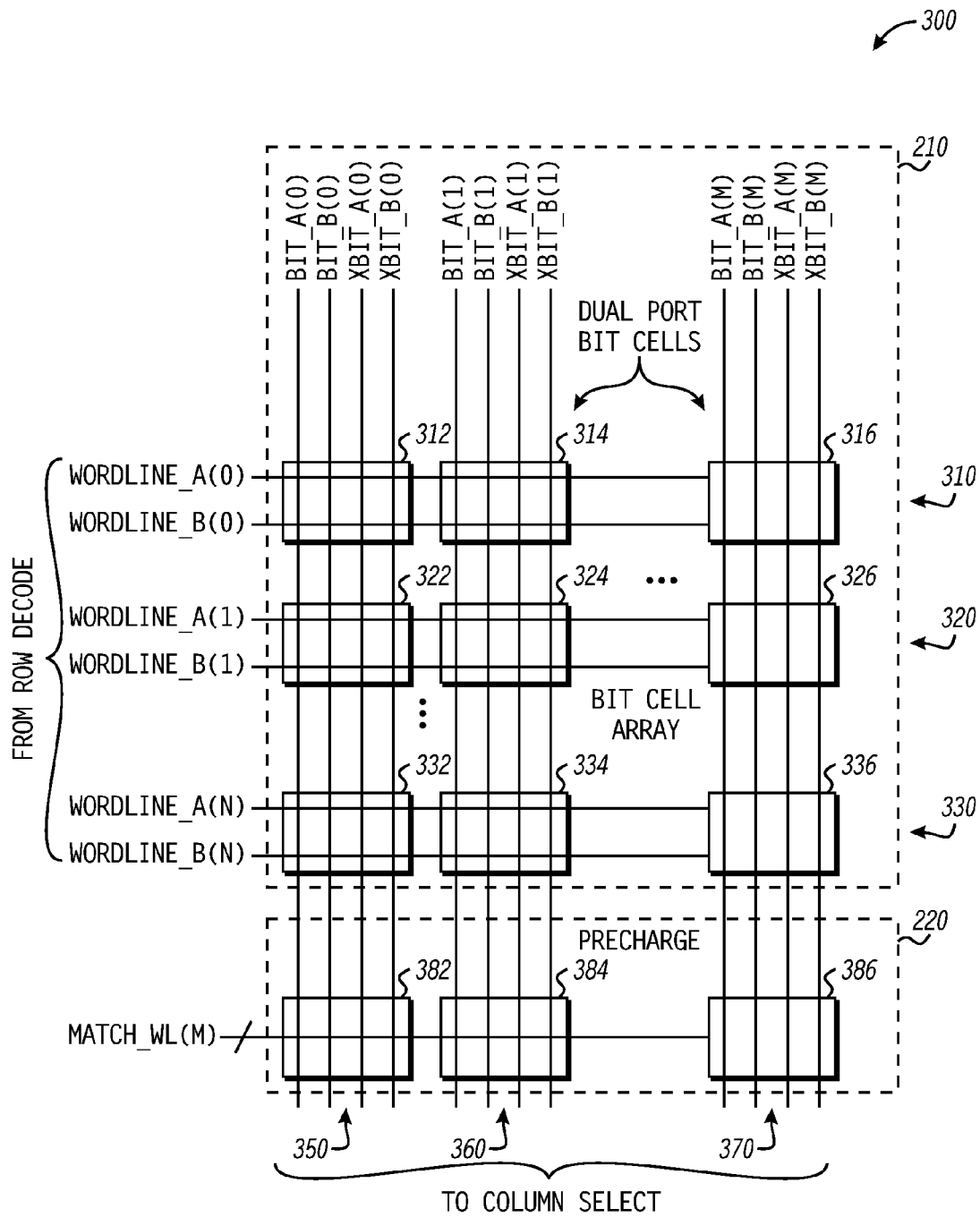
FIG. 3 is a block diagram illustrating a bit cell array and precharge modules of the dual port SRAM of FIG. 2 in accordance with a specific embodiment of the present disclosure.

FIG. 3 is a block diagram illustrating bit cell array 210 and precharge module 220 of the dual port SRAM of FIG. 2 in accordance with a specific embodiment of the present disclosure. Bit cell array 210 is configured as an array of rows 310, 320, and 330 associated with respective word lines, and columns 350, 360, and 370 associated with respective bit-lines. Bit cell array 210 includes dual port bit cells 312, 314, 316, 322, 324, 326, 332, 334, and 336. Precharge module 220 includes column precharge modules 382, 382, and 386.

Dual port bit cells 312, 314, and 316 of row 310 each receive signals WORDLINE_A(0) and WORDLINE_B(0). Dual port bit cells 322, 324, and 326 of row 320 each receive signals WORDLINE_A(1) and WORDLINE_B(1). Dual port bit cells 332, 334, and 336 of row 330 each receive signals WORDLINE_A(N) and WORDLINE_B(N). Column precharge modules 382, 384, and 386 each receive a signal MATCH_WL(M). Dual port bit cells 312, 322, and 332, and column precharge cell 382 of column 350 are each connected to bit-line nodes BIT_A(0), XBIT_A(0), BIT_B(0), and XBIT_B(0). Dual port bit cells 314, 324, and 334, and column precharge cell 384 of column 360 are each connected to bit-line nodes BIT_A(1), XBIT_A(1), BIT_B(1), and XBIT_B(1). Dual port bit cells 316, 326, and 336, and column precharge cell 386 of column 370 are each connected to bit-line nodes BIT_A(N), XBIT_A(N), BIT_B(N), and XBIT_B(N).

Each of dual port bit cells 312-336 can be individually accessed via an appropriate configuration of associated word lines and associated bit-lines. Column precharge cells 382, 384, and 386 are configured to provide a precharge level voltage to selected bit-lines based on a precharge clock signals (not shown). The precharge at selected bit-lines can be disabled by asserting a corresponding bit of signal MATCH_WL(M). Furthermore, the assertion of a particular bit of signal MATCH_WL(M) results in the electrical connection of a bit-line associated with PORT_A to a bit-line associated with port B, as described in detail with reference to FIG. 4.

Figure 4:
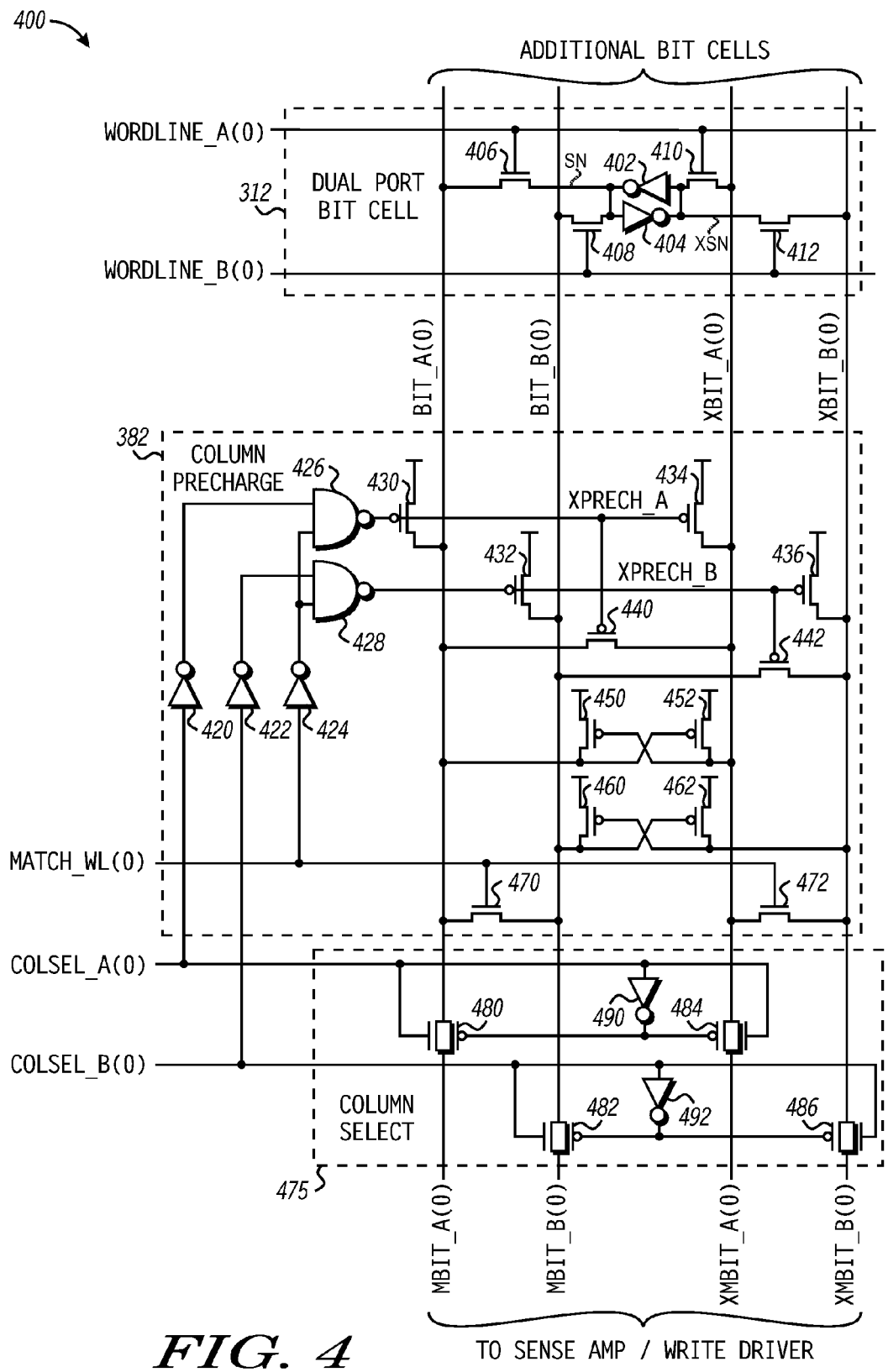
FIG. 4 is a schematic diagram illustrating a column of the dual port SRAM of FIG. 2 in accordance with a specific embodiment of the present disclosure.

FIG. 4 is a schematic diagram illustrating a single column 400 of dual port SRAM 110 of FIG. 2 in accordance with a specific embodiment of the present disclosure. Column 400 includes dual port bit cell 312 and column precharge module 382 of FIG. 3, and a single-column select module 475. A column at dual port SRAM 110 includes a plurality of dual port bit cells, however only one dual port bit cell is illustrated at column 400 for clarity.

Dual port bit cell 312 has a storage module that includes inverter 402 and inverter 404 connected in a latch configuration. Inverter 402 has an input connected to a storage node labeled "XSN," and an output connected to storage node labeled "SN." An n-channel metal oxide semiconductor (NMOS) transistor 406 has a current electrode connected to bit-line BIT_A(0), a control electrode connected to word line WORDLINE_A(0), and a current electrode connected to storage node SN. NMOS transistor 408 has a current electrode connected to bit-line BIT_B(0), a control electrode connected to word line WORDLINE_B(0), and a current electrode connected to storage node SN. NMOS transistor 410 has a current electrode connected to bit-line XBIT_A(0), a control electrode connected to word line WORDLINE_A(0), and a current electrode connected to storage node XSN. NMOS transistor 412 has a current electrode connected to bit-line XBIT_B(0), a control electrode connected to word line WORDLINE_B(0), and a current electrode connected to storage node XSN.

Dual port bit cell 312 is configured to store information that can be subsequently retrieved. Information can be stored via PORT_A by asserting WORDLINE_A(0) and a column select signal labeled "COLSEL_A," and driving selected bit-lines labeled "MBIT_A(0)" and "XMBIT_A(0)" using the write driver of sense amplifier and write driver module 240 to a logic-high or logic-low level, determined by signal DATA_A. Information can be retrieved from dual port bit cell 312 by asserting the same word line and column select signals, and enabling the sense amplifier of sense amplifier and write driver module 240. Bit-lines BIT_A(0) and XBIT_A(0) are precharged to a logic-high level before the read operation is performed. Information can be stored and retrieved at dual port bit cell 312 via PORT_B in the same way using WORDLINE_B(0) and COLSEL_B(0).

Column precharge module 382 includes p-channel MOS (PMOS) transistors 430, 432, 434, 436. 440, 442, 450, 452, 460, and 462, NMOS transistors 470 and 472, NAND gates 426 and 428, and inverters 420, 422, and 424. PMOS transistor 430 has a current electrode connected to a precharge reference node connected to voltage reference VCC, a control electrode connected to node XPRECH_A, and a current electrode connected to bit-line BIT_A(0). PMOS transistor 432 has a current electrode connected to reference voltage VCC, a control electrode connected to node XPRECH_B, and a current electrode connected to bit-line BIT_B(0). PMOS transistor 434 has a current electrode connected to reference voltage VCC, a control electrode connected to node XPRECH_A, and a current electrode connected to bit-line XBIT_A(0). PMOS transistor 436 has a current electrode connected to reference voltage VCC, a control electrode connected to node XPRECH_B, and a current electrode connected to bit-line XBIT_B(0). PMOS transistor 440 has a current electrode connected to bit-line BIT_A(0), a control electrode connected to node XPRECH_A(0), and a current electrode connected to bit-line XBIT_A(0). PMOS transistor 442 has a current electrode connected to bit-line BIT_B(0), a control electrode connected to node XPRECH_B(0), and a current electrode connected to bit-line XBIT_B(0).

NMOS transistor 470 has a current electrode connected to bit-line BIT_A(0), a control electrode connected to node MATCH_WL(0), and a current electrode connected to bit-line BIT_B(0). NMOS transistor 472 has a current electrode connected to bit-line XBIT_A(0), a control electrode connected to node MATCH_WL(0), and a current electrode connected to bit-line XBIT_B(0). NAND gate 426 has an input connected to the output of invert 420, an input connected to the output of inverter 424, and an output connected to node XPRECH_A(0). NAND gate 428 has an input connected to the output of invert 422, an input connected to the output of inverter 424, and an output connected to node XPRECH_B(0). Inverter 420 has an input connected to node COLSEL_A(0). Inverter 422 has an input connected to node COLSEL_B(0). Inverter 424 has an input connected to node MATCH_WL(0).

Column precharge module 382 is configured to charge bit-lines BIT_A(0), XBIT_A(0), BIT_B(0), and XBIT_B(0) to a logic-high level based on signals at nodes COLSEL_A(0), COLSEL_B(0), and MATCH_WL(0). For example, when node COLSEL_A(0) is at a logic-low level, bit-lines BIT_A(0) and XBIT_A(0) are precharged, unless node MATCH_WL(0) is at a logic-high level. When node COLSEL_B(0) is at a logic-low level, bit-lines BIT_B(0) and XBIT_B(0) are precharged, unless node MATCH_WL(0) is at a logic-high level. A read operation begins at PORT_A of dual port SRAM 110 begins by precharging bit-lines BIT_A(0) and XBIT_A(0). The assertion of a signal at node COLSEL_A(0) terminates the precharge, as does an assertion of a signal at node MATCH_WL(0). A read operation begins at PORT_B of dual port SRAM 110 begins by precharging bit-lines BIT_B(0) and XBIT_B(0). The assertion of a signal at node COLSEL_B(0) terminates the precharge, as does an assertion of a signal at node MATCH_WL(0). Thus, the precharge of a bit-line is mutually exclusive of the selection of that bit-line at column select module 475.

A signal at node MATCH_WL(0) is asserted by control module 1102 when a dummy access is detected at a dual port bit cell. For example, if a write operation is underway at PORT_A of dual port SRAM 110 to store information at dual port bit cell 312, and a read or a write operation is concurrently underway via PORT_B of dual port SRAM 110 at another dual port bit cell at the same row, such as dual port bit cell 316 of FIG. 2, that is also connected to word line pair WORDLINE_A(0) and WORDLINE_B(0), a signal at node MATCH_WL(0) is asserted. In response to MATCH_WL(0) being asserted, precharge of all bit-lines associated with dual port bit cell 312 is disabled, signals at bit-lines BIT_A(0) and BIT_B(0) are equalized, and bit-lines XBIT_A(0) and signals at XBIT_B(0) are equalized. Thus, during a dummy access at dual port bit cell 312, which results from a read or a write operation at another bit cell at the same row as dual port bit cell 312, precharge at the bit-lines associated with the dummy access are disabled. The write margin at PORT_A of dual port bit cell 312 is increased.

For example, when a write operation is underway at dual port bit cell 312 via PORT A, and a read or write operation is concurrently underway at another dual port bit cell at the same row, PMOS transistors 432 and 436 associated with PORT_B of dual port bit cell 312 are deactivated, and NMOS transistors 470 and 472 are activated. The deactivation of PMOS transistors 432 and 436 prevent contention between precharge associated with bit-lines BIT_B(0) and XBIT_B(0), and the write driver associated with PORT A. The activation of NMOS transistors 470 and 472 allow the write driver that is driving bit-lines associated with PORT A, to also drive bit-lines associated with port B.

Column precharge module 382 also includes a keeper circuit including transistors 450 and 452 to maintain a precharge at bit-lines XBITB(0) and BITB(0), and a keeper circuit including transistors 460 and 462 a precharge at bit-lines XBITB(1) and BITB(2). PMOS transistor 450 has a current electrode connected to voltage reference VCC, a control electrode connected to bit-line XBIT_A(0), and a current electrode connected to bit-line BIT_A(0). PMOS transistor 452 has a current electrode connected to voltage reference VCC, a control electrode connected to bit-line BIT_A(0), and a current electrode connected to bit-line XBIT_A(0). PMOS transistor 460 has a current electrode connected to voltage reference VCC, a control electrode connected to bit-line XBIT_B(0), and a current electrode connected to bit-line BIT_B(0). PMOS transistor 462 has a current electrode connected to voltage reference VCC, a control electrode connected to bit-line BIT_B(0), and a current electrode connected to bit-line XBIT_B(0).

Column select module 475 includes complementary MOS (CMOS) transmission gates 480, 482, 484, and 486, and inverters 490 and 492. CMOS transmission gate 480 has a current electrode connected to bit-line BIT_A(0), an n-channel control electrode connected to node COLSEL_A(0), a p-channel control electrode connected to the output of invert 490, and a current electrode connected to a node labeled "MBIT_A(0)." CMOS transmission gate 484 has a current electrode connected to bit-line XBIT_A(0), an n-channel control electrode connected to node COLSEL_A(0), a p-channel control electrode connected to the output of invert 490, and a current electrode connected to a node labeled "XMBIT_A(0)." CMOS transmission gate 482 has a current electrode connected to bit-line BIT_B(0), an n-channel control electrode connected to node COLSEL_B(0), a p-channel control electrode connected to the output of invert 492, and a current electrode connected to a node labeled "MBIT_B(0)." CMOS transmission gate 486 has a current electrode connected to bit-line XBIT_B(0), an n-channel control electrode connected to node COLSEL_B(0), a p-channel control electrode connected to the output of invert 492, and a current electrode connected to a node labeled "XMBIT_B(0)." A CMOS transmission gate includes an NMOS and a PMOS transistor that are connected in a manner such that the conductive path of each transistor forms a parallel circuit, thereby providing a switch operable to conduct signals whose voltage level extends between a ground potential and the level of voltage reference VCC.

CMOS transmission gates 480 and 484 are activated during a read or a write operation at PORT_A of dual port bit cell 312. CMOS transmission gates 482 and 486 are activated during a read or a write operation at PORT_B of dual port bit cell 312. For example, each column at dual port SRAM 110 is selected by an associated column select signal, e.g. COLSEL_A(0) and COLSEL_B(0). Column select module 230 includes column select module 475, and is configured to select a particular bit-line pair e.g. as BIT_A(0) and XBIT_A(0) and electrically connect that selected bit-line pair to sense amplifier and write driver module 240.

Figure 5:
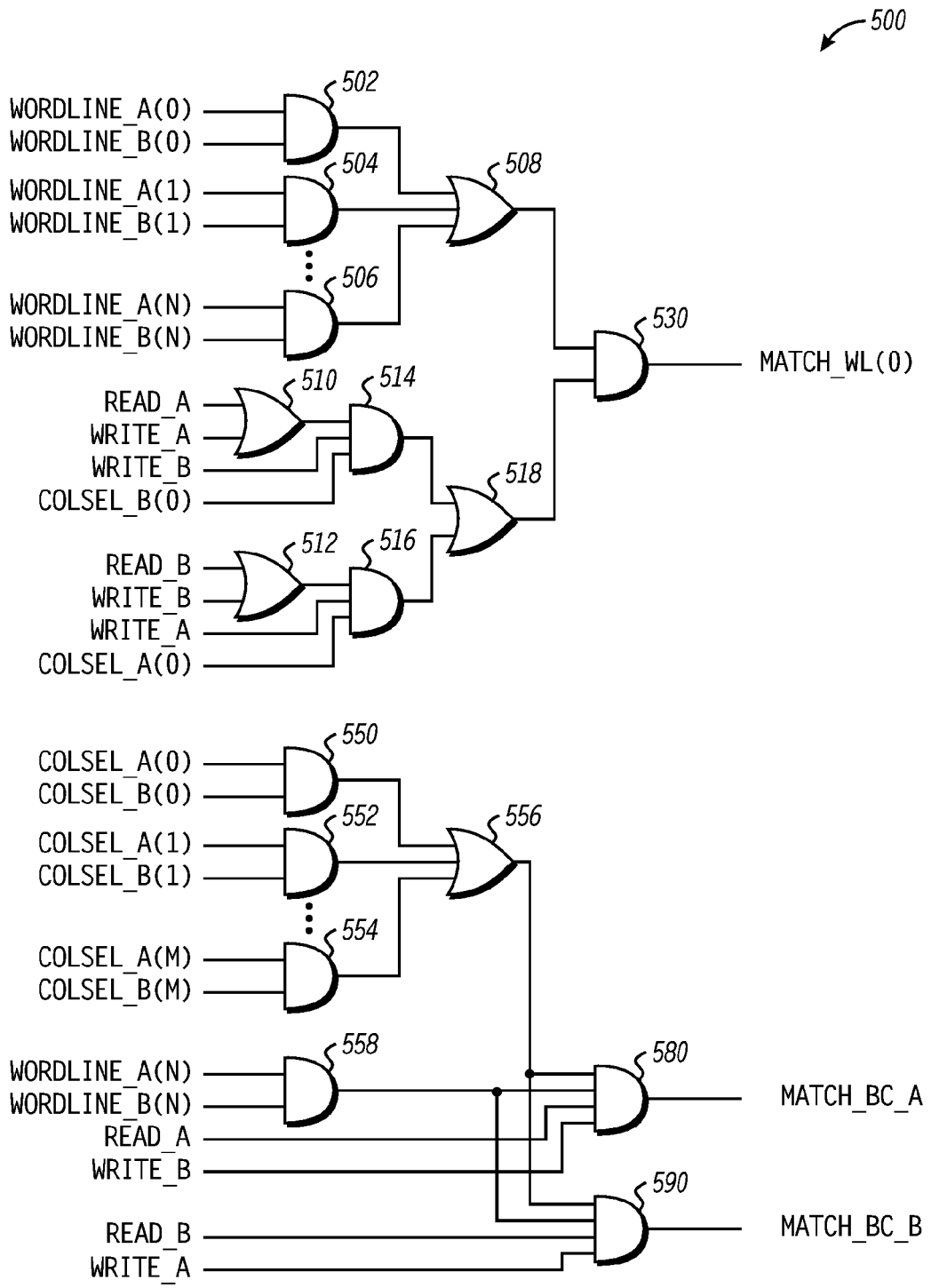
FIG. 5 is a schematic diagram illustrating the control module of FIG. 2 in accordance with a specific embodiment of the present disclosure.

FIG. 5 is a schematic diagram illustrating control module 1102 of FIG. 2 in accordance with a specific embodiment of the present disclosure. Control module 1102 is configured to generate the match word line signal MATCH_WL(0), the match bit cell signal MATCH_BC_A associated with PORT A, and the match bit cell signal MATCH_BC_B associated with port B. The generation of signals MATCH_WL(0), MATCH_BC_A, and MATCH_BC_B are illustrated based on decoded signals provided by row decode module 202 and column decode module 204 to improve functional clarity. It will be appreciated that word line and column select signals included at FIG. 5 represent particular decoding of signal ADDRESS_A and ADDRESS_B.

Signal MATCH_WL(0) is provided to column precharge module 382 of column 350 based on a write operation at one port of a dual port bit cell associated with row 310 and column 350, and a concurrent read or write operation at the other port of any dual port bit cell also on row 310. For example, signal MATCH_WL(0) is asserted when a write operation via PORT_A at dual port bit cell 312 is concurrent with a second access at another dual port bit cell, such as dual port bit cell 314, via port B. The second access at PORT_B of dual port bit cell 314 creates a dummy access at NMOS transistor 412 of dual port bit cell 312. Because signal MATCH_WL(0) is associated with column 350, signal MATCH_WL(0) is also asserted based on a similar condition at any other row, such as row 320 and row 330. Similar circuits provide additional MATCH_WL(M) signals corresponding to each column. Signal MATCH_WL(0) is negated during periods of access inactivity via a second port at row 310. For example, signal MATCH_WL(0) is not asserted if a write operation is in progress via PORT_B at dual port bit cell 312 and a read or a write operation is not concurrently in progress via PORT_A at row 310.

The generation of signal MATCH_WL(0) includes AND gates 502, 504, 506, 514, 516, and 530, and OR gates 508, 510, 512, and 518. AND gate 502 has an input to receive signal WORDLINE_A(0), an input to receive signal WORDLINE_B(0), and an output connected to an input of OR gate 508. AND gate 504 has an input to receive signal WORDLINE_A(1), an input to receive signal WORDLINE_B(1), and an output connected to another input of OR gate 508. AND gate 506 has an input to receive signal WORDLINE_A(N), an input to receive signal WORDLINE_B(N), and an output connected to another input of OR gate 508. Additional AND gates (not shown) are associated with additional word line pairs, and are connected to corresponding inputs at OR gate 508. OR gate 508 has an output connected to an input of AND gate 530. OR gate 510 has an input to receive signal READ_A, an input to receive signal WRITE_A, and an output connected to AND gate 514. AND gate 514 has another input to receive signal WRITE_B, another input to receive signal COLSEL_B(0), and an output connected to an input of OR gate 518. OR gate 512 has an input to receive signal READ_B, an input to receive signal WRITE_B, and an output connected to AND gate 516. AND gate 516 has another input to receive signal WRITE_A, another input to receive signal COLSEL_A(0), and an output connected to another input of OR gate 518. OR gate 518 has an output connected to another input of AND gate 530. And gate 530 has an output to provide signal MATCH_WL(0).

Signals MATCH_BC_A and MATCH_BC_B are provided to row decode module 202 and indicates that a write operation via one port of dual port SRAM 110 and a read operation via the other port of dual port SRAM 110 are concurrently underway at a single dual port bit cell. The assertion of signal MATCH_BC_A deactivates signals WORDLINE_A(0:N), and the assertion of signal MATCH_BC_B deactivates signals WORDLINE_B(0:N). For example, if a write operation is underway at dual port bit cell 312 via PORT A, and a read operation is also concurrently underway at dual port bit cell 312 via port B, the read operation at PORT_B is disabled by deactivating signals WORDLINE_B(0:N). This is necessary because the read operation can be non-deterministic depending on the relative timing of the write operation and the read operation at dual port bit cell 312.

AND gate 550 has an input to receive signal COLSEL_A(0), another input to receive signal COLSEL_B(0), and an output connected to an input of OR gate 556. AND gate 552 has an input to receive signal COLSEL_A(1), another input to receive signal COLSEL_B(1), and an output connected to another input of OR gate 556. AND gate 554 has an input to receive signal COLSEL_A(M), another input to receive signal COLSEL_B(M), and an output connected to another input of OR gate 556. Additional AND gates (not shown) are associated with additional column select pairs, and are connected to corresponding inputs at OR gate 556. AND gate 558 has an input to receive signal WORDLINE_A(N), another input to receive signal WORDLINE_B(N), and an output connected to an input of AND GATE 580 and an input of AND gate 590. AND gate 580 and another input to receive signal READ_A, another input to receive signal WRITE_B, and an output to provide signal MATCH_BC_A. AND gate 590 has another input to receive signal READ_B, another input to receive signal WRITE_A, and an output to provide signal MATCH_BC_B.

Figure 6:
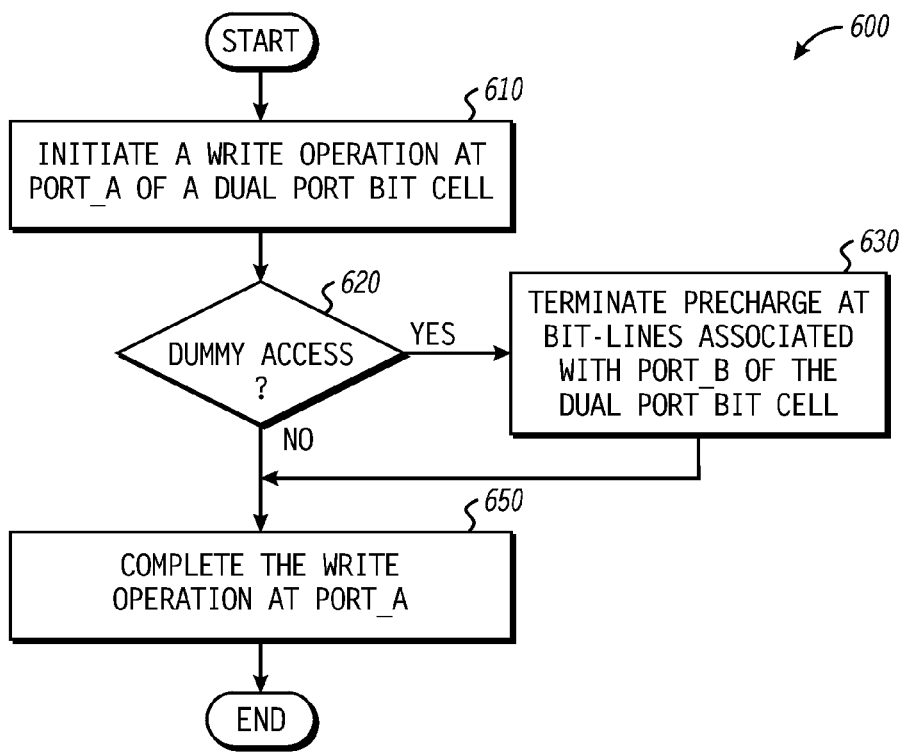
FIG. 6 is a flow diagram illustrating a method in accordance with a specific embodiment of the present disclosure.

FIG. 6 is a flow diagram illustrating a method 600 in accordance with a specific embodiment of the present disclosure. Method 600 begins at block 610 wherein a write operation is initiated at a dual port bit cell, such as dual port bit cell 312, via PORT_A of dual port SRAM 110. The flow proceeds to decision block 620 where it is determined whether PORT_B of the dual port bit cell is activated due to a dummy access. For example, if a read operation at dual port bit cell 316 via PORT_B is concurrent with the write operation at dual port bit cell 312 via PORT A, signal WORDLINE_B(0) is asserted and NMOS transistors 408 and 412 are activated at dual port bit cell 312 even though the read operation is associated with information stored at dual port bit cell 316. If a dummy access is not detected, the flow proceeds to block 650 where the write operation is completed. If a dummy access is detected, the flow proceeds instead to block 630 where the precharge at the bit-lines associated with PORT_B of the dual port bit cell is terminated. Referring again to the example, a dummy read at dual port bit cell 312 results in the assertion of signal MATCH_WL(0), which deactivates PMOS precharge transistors 432 and 436. The flow proceeds to block 650 where the write operation is completed.

Figure 7:
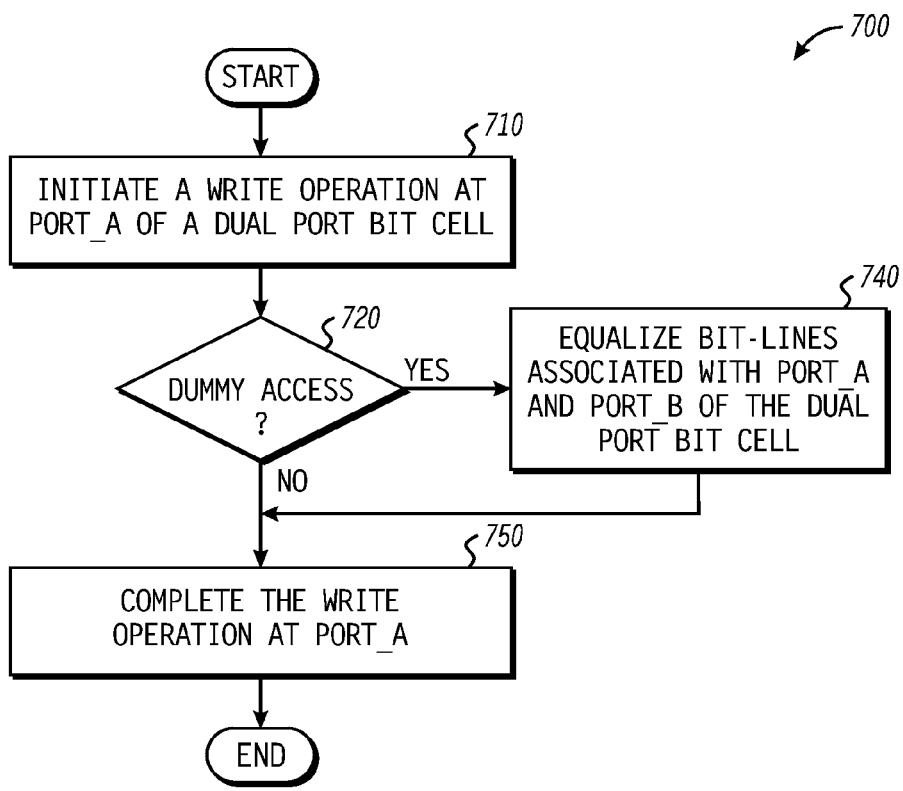
FIG. 7 is a flow diagram illustrating a method in accordance with a specific embodiment of the present disclosure.

FIG. 7 is a flow diagram illustrating a method 700 in accordance with a specific embodiment of the present disclosure. Method 700 begins at block 710 wherein a write operation is initiated at dual port bit cell 312. The flow proceeds to decision block 620 where it is determined whether PORT_B of the dual port bit cell is activated due to a dummy access. If a dummy access is not detected, the flow proceeds to block 750 where the write operation is completed. If a dummy access is detected, the flow proceeds instead to block 740 where the bit-lines associated with PORT_A and PORT_B of the dual port bit cell are equalized. Referring again to the example, a dummy read at dual port bit cell 312 results in the assertion of signal MATCH_WL(0), which activates NMOS transistors 470 and 472, thereby equalizing the potential between nodes BIT_A(0) and BIT_B(0) and between nodes XBIT_A(0) and XBIT_B(0). The flow proceeds to block 750 where the write operation is completed.

Figure 8:
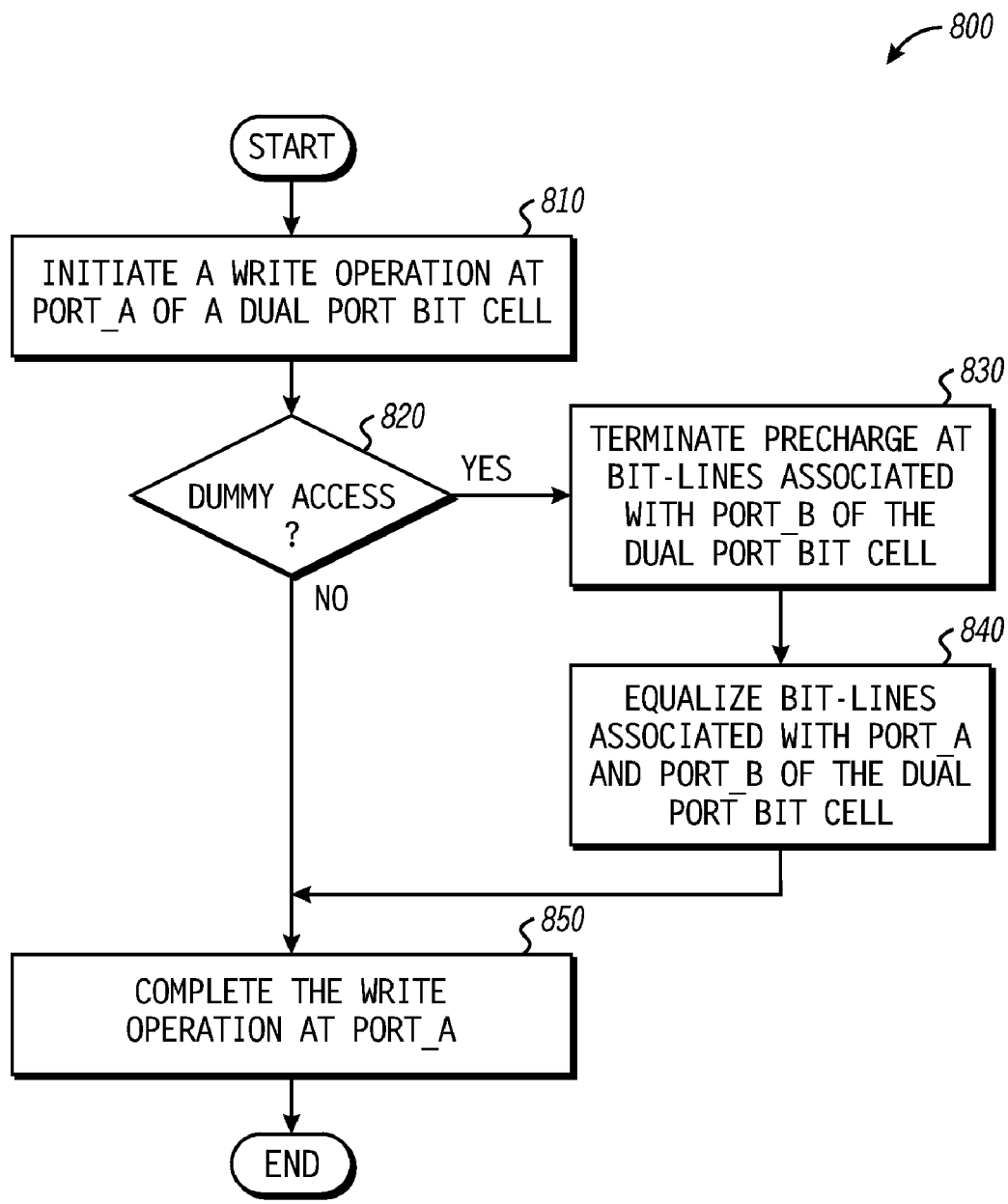
FIG. 8 is a flow diagram illustrating a method in accordance with a specific embodiment of the present disclosure.

FIG. 8 is a flow diagram illustrating a method 800 in accordance with a specific embodiment of the present disclosure. Method 800 begins at block 810 wherein a write operation is initiated at dual port bit cell 312. The flow proceeds to decision block 820 where it is determined whether PORT_B of the dual port bit cell is activated due to a dummy access. If a dummy access is not detected, the flow proceeds to block 850 where the write operation is completed. If a dummy access is detected, the flow proceeds instead to block 830 where the precharge at the bit-lines associated with PORT_B of the dual port bit cell is terminated. The flow proceeds to block 840 where the bit-lines associated with PORT_A and PORT_B of the dual port bit cell are equalized. The flow proceeds to block 850 where the write operation is completed.

Figure 9:
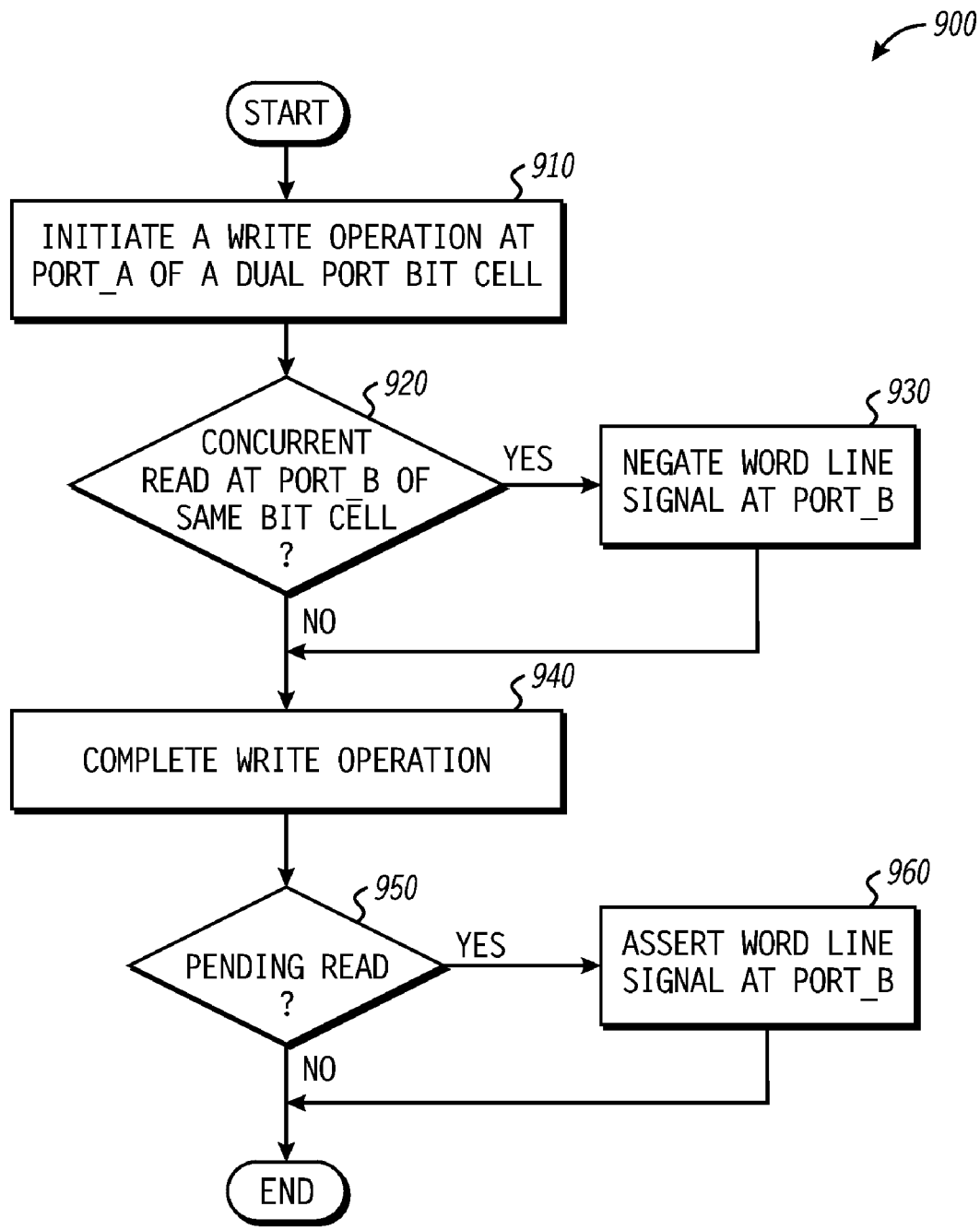
FIG. 9 is a flow diagram illustrating a method in accordance with a specific embodiment of the present disclosure.

FIG. 9 is a flow diagram illustrating a method 900 in accordance with a specific embodiment of the present disclosure. Method 900 begins at block 910 wherein a write operation is initialized at PORT_A of a dual port bit cell, such as dual port bit cell 312. The flow proceeds to decision block 920 where it is determined whether a read operation is concurrently active at PORT_B of the same dual port bit cell. If no read operation is active, the flow proceeds to block 940 where the write operation at PORT_A is completed. If a read operation is active at PORT_B of the same dual port bit cell, the flow proceeds to block 930 where the word line associated with PORT_B is negated. For example, if a read operation is already in progress via PORT_B of dual port bit cell 312 and a write operation via PORT_A is initialized at dual port bit cell 312, the assertion of signal MATCH_BC_B by control module 1102 causes signal WORDLINE_B(0) to transition from an asserted state to a negated state, and to remain negated for the duration of the write operation. Similarly, if a write operation via PORT_A at dual port bit cell 312 is initialized, and a subsequent and concurrent read operation via PORT_B is attempted, signal MATCH_BC is asserted and signal WORDLINE_B(0) remains negated for the duration of the write operation. The flow proceeds to block 940 where the write operation is completed.

The flow proceeds to decision block 950 where it is determined whether a preempted read operation via PORT_B is still active. If a read operation was disabled at a dual port bit cell by negating the word line associated with the read operation and the read operation remains active, the flow proceeds to block 960 where the word line corresponding to the preempted read operation is asserted and the read operation is allowed to resume. It will be appreciated that when a read operation is preempted for any period of time by negating the word line associated with the read operation, data retrieved by the read operation can be indeterminate and may be presumed invalid. In a particular embodiment, control module 1102 can be configured to alert the applicable memory interface module that the read operation was incomplete so that the memory interface module can reissue the read request if desired.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

For example, whereas the memory interface illustrated at FIG. 1 represents an exemplary interface implementation, another embodiment can include different or additional memory interface signals. For example, additional enable and clock signals can be provided to dual port SRAM 110.

The term metal oxide semiconductor used herein is synonymous with metal oxide semiconductor field effect transistor (MOSFET). The methods disclosed herein can be implemented in any technology that includes precharged bit-lines.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A device comprising a plurality of bit cells, a first bit cell of the plurality of bit cells comprising:
   a first storage module comprising a first storage node;
   a first transistor comprising a first current electrode coupled to the first storage node, a second current electrode coupled to a first bit line, and a control electrode coupled to a first wordline;
   a second transistor comprising a first current electrode coupled to the first storage node, a second current electrode coupled to a second bit line, and a control electrode coupled to a second wordline; and
   a third transistor comprising a first current electrode coupled to the first bit line, a second current electrode coupled to the second bit line, and a control electrode;
   a reference node to provide a precharge signal;
   a fourth transistor comprising a first current electrode coupled to the reference node, a second current electrode coupled to the first bit line, and a control electrode;
   a fifth transistor comprising a first current electrode coupled to the reference node, a second current electrode coupled to the second bit line, and a control electrode; and
   a control module coupled to the control electrode of the fifth transistor and operable, in response to a dummy access of the first storage module at the second transistor, to deactivate the fifth transistor during the dummy access of the first bit cell.

2. The device of claim 1 wherein the control module is further coupled to the control electrode of the third transistor and operable, in response to a dummy access of the first bit cell, to activate the third transistor.

3. The device of claim 2, wherein the control module is further operable in response to the dummy access of the first bit cell and a write access of the first bit cell, to activate the third transistor during the dummy access of the first storage cell.

4. The device of claim 1, wherein the control module is further operable to deactivate the fifth transistor in response to the dummy access of the first bit cell and a write access of the first bit cell.

5. The device of claim 4, wherein the control module is further operable to deactivate the fifth transistor in response to the dummy access of the first bit cell and the write access of the first bit cell occurring concurrently.

6. The device of claim 1, wherein the control module is operable, in response to access inactivity at the second word line, to activate the fifth transistor during the access inactivity.

7. The device of claim 1 the control module further coupled to the control electrode of the third transistor and operable, in response to a dummy access of the first storage cell occurring concurrently with a write access of the first storage cell, to activate the third transistor.

8. A method comprising: terminating a precharge at a first bit line of a first port of a multi-port cell in response to determining an occurrence of a dummy access at the first port, and equalizing the first bit line of the first port of the multi-port cell to a second bit line of a second port of the multi-port cell in response to determining the occurrence of the dummy access at the first port.

9. The method of claim 8, wherein equalizing the first bit line to the second bit line is in response to the occurrence of the dummy access at the first port and an occurrence of a write access at the second port of the multi-port bit cell.

10. The method of claim 9, wherein equalizing the first bit line to the second bit line is in response to the dummy access and the write access being concurrent.

11. The method of claim 8, wherein terminating the precharge is further in response to the occurrence of a write access at a second port of the multi-port bit cell.

12. The method of claim 11, wherein the terminating the precharge is in response to the dummy access and the write access being concurrent.

13. The method of claim 8 further comprising:
maintaining the precharge at the first bit line in response to detecting access inactivity at the second port.

14. The method of claim 9 further comprising:
negating a signal provided to a word line of the first port in response to the dummy access being a read access and the dummy access occurring concurrently with the write access.

15. The method of claim 14 further comprising:
asserting the signal provided to the word line of the first port in response to the read access prior to negating the signal.

16. The method of claim 9 further comprising:
asserting a signal provided to a word line of the first port in response to a write access at the first port of the multi-port bit cell; and
maintaining a negated signal at a word line of a second port of the multi-port bit cell in response to a read access request to the second port of the multi-port bit cell occurring while the signal provided to the word line of the first port is asserted.

17. The method of claim 16, further comprising:
asserting the signal at the word line of the second port upon completion of the write access at the first port.

18. A device comprising a plurality of bit cells, a first bit cell of the plurality of bit cells comprising:
a first storage module comprising a first storage node and a second storage node;
a first transistor comprising a first current electrode coupled to the first storage node, a second current electrode coupled to a first bit line, and a control electrode coupled to a first wordline;
a second transistor comprising a first current electrode coupled to the first storage node, a second current electrode coupled to a second bit line, and a control electrode coupled to a second wordline;
a third transistor comprising a first current electrode coupled to the first bit line, a second current electrode coupled to the second bit line, and a control electrode;
a fourth transistor comprising a first current electrode coupled to the second storage node, a second current electrode coupled to a third bit line, and a control electrode coupled to the first wordline;
a fifth transistor comprising a first current electrode coupled to the second storage node, a second current electrode coupled to a fourth bit line, and a control electrode coupled to the second wordline;
a sixth transistor comprising a first current electrode coupled to the third bit line, a second current electrode coupled to the fourth bit line, and a control electrode; and
a seventh transistor comprising a first current electrode coupled to a voltage reference for precharging the first bit line, a second current electrode coupled to the first bit line, and a control electrode coupled to a control circuit, the control circuit to terminate a precharge at the first bit line in response to a dummy access to the first storage node.

* * * * *